United States Patent [19]

Yamada

[11] Patent Number: 5,042,887

[45] Date of Patent: Aug. 27, 1991

[54] HIGH ENERGY ULTRAVIOLET LASER REFLECTOR GROWN ON A SINGLE CRYSTALLINE SUBSTRATE

[75] Inventor: Isao Yamada, Kyoto, Japan

[73] Assignee: Epion Corporation, Bedford, Mass.

[21] Appl. No.: 429,204

[22] Filed: Oct. 30, 1989

[30] Foreign Application Priority Data

Apr. 19, 1989 [JP] Japan .................................. 1-101083

[51] Int. Cl.$^5$ .......................... G02B 5/08; C23C 16/00
[52] U.S. Cl. .................................. 359/360; 427/255; 359/884; 359/838
[58] Field of Search ................. 350/1.7, 642, 600, 607, 350/609, 1.1; 372/99; 427/225, 255

[56] References Cited

U.S. PATENT DOCUMENTS

| | | | |
|---|---|---|---|
| 4,482,209 | 11/1984 | Grewal et al. | 350/642 |
| 4,799,454 | 1/1989 | Ito | 188/723 |
| 4,805,555 | 2/1989 | Itoh | 118/719 |

FOREIGN PATENT DOCUMENTS

| | | |
|---|---|---|
| 293232 | 11/1988 | European Pat. Off. |
| 61-238957 | 10/1986 | Japan |
| 63-296001 | 12/1988 | Japan |
| 2178187 | 2/1987 | United Kingdom |

OTHER PUBLICATIONS

Hutcheson, E. T., Hass, G. and Cox, J. T., *Effect of Deposition Rate and Substrate Temperature on the Vacuum Ultraviolet Reflectance of MgF$_2$— and LiF—Overcoated Aluminum Mirrors*, Applied Optics, vol. 11, No. 10, Oct. 1972, pp. 2245-2248.

Yamada et al., *Epitaxial Growth of Al on Si(111) and Si(100) by Ionized-Cluster Beam*, J. Appl. Phys. 56 (10), Nov. 15, 1984, pp. 2746-2750.

Yamada et al., *Ionized Cluster Beam Epitaxy of Single Crystalline Aluminum Films on Semiconductors and Insulators as an Approach to New Device Structures*, Extended Abstract of the 17th Conf. on Solid State Devices and Materials, Tokyo, 1985, pp. 313-316.

Takagi, *History and Current Status of the Ionized Cluster Beam Technique*, Proc. Int'l Workshop on ICBT Tokyo-Kyoto (1986).

Yamada et al., *Current Status of Ionized-Cluster Beam Technique: A Low Energy Ion Beam Deposition*, Nuclear Instruments and Methods in Physics Research (1987), pp. 120-123.

Primary Examiner—Bruce Y. Arnold
Assistant Examiner—David R. Parsons
Attorney, Agent, or Firm—Thomas J. Engellenner

[57] ABSTRACT

Optical reflectors and methods of constructing optical reflectors having high damage thresholds, durability and general applicability are disclosed in which a highly planar substrate, such as a single crystal silicon or other single crystalline material, is disposed within a deposition chamber and oriented to present a particular crystallographic plane. An epitaxial layer of reflective metal, such as aluminum, is grown upon the substrate by ion beam or other method of deposition and then covered with a transparent protective coating.

16 Claims, No Drawings

HIGH ENERGY ULTRAVIOLET LASER REFLECTOR GROWN ON A SINGLE CRYSTALLINE SUBSTRATE

BACKGROUND OF THE INVENTION

The technical field of this invention is optical reflectors and in particular, the invention concerns methods and materials for fabrication of durable, high quality reflectors for lasers and other high energy light sources.

High energy light sources operating at short wavelengths, such as ultraviolet (UV) lasers and the like, require extremely strong and durable reflectors for beam manipulation. Because conventional mirrors and metal coatings tend to fail at high energy intensities, laser systems have become increasingly dependent on multilayered dielectric materials which are capable of withstanding high energies to provide more durable reflectors.

However, the reflectivity of these dielectric materials is highly dependent on their thickness as well as the laser wavelengths and the angle of the incident light. As a consequence, dielectric reflectors typically are designed for a specific wavelength and incidence angle thereby preventing economy in mass production.

There exists a need for more adaptable reflectors which can still withstand the stresses associated with high energy light sources. In particular, a durable, high quality reflector which can be of general utility over a broad range of wavelengths and regardless of incidence angle of the light would satisfy a long-felt need in the art.

Accordingly, an objective of the present invention is to produce reflectors which are not dependent on the wavelength or incidence angle of the light, unlike the multilayered dielectric reflectors, and which are at least as durable as multilayered dielectric reflectors while maintaining high reflective efficiencies.

SUMMARY OF THE INVENTION

Optical reflectors and methods of constructing optical reflectors having high damage thresholds, durability and general applicability are disclosed. In accordance with the invention, a highly planar substrate, such as a single crystal silicon or other single crystalline material, is disposed within a deposition chamber and oriented to present a particular crystallographic plane. An epitaxial layer of reflective metal, such as aluminum, is grown upon the substrate by ion beam deposition and then covered with a transparent protective coating.

In one aspect of the invention, aluminum films are epitaxially grown on single crystalline substrates, such that the aluminum films have a single crystal or bicrystal structure, which is completely different from conventionally vacuum deposited films. These aluminum films are at least as durable as multilayered dielectric films and also exhibit high reflective efficiencies which do not deteriorate over long periods of use. The optical reflectors are constructed by epitaxially growing an aluminum film on a single crystalline substrate and then preferably covering the aluminum film with a transparent protective coating which has low optical absorption.

For the epitaxial growth of aluminum, a highly planar substrate substantially free of defects is required. Preferred substrate's include, for example, single crystal silicon, sapphire, and quartz. A single crystal epitaxially grown on the substrate tends to have a corresponding crystal orientation with the substrate. On a Si(111) substrate, Al(111) crystal grows, while Al(110) bicrystal grows on Si(100) single crystal substrate.

In one preferred embodiment, ion beams can be used to deposit the epitaxial layer. Ion beams useful in inducing epitaxial growth include both cluster ion beams and monoatomic ion beams. For most applications, the use of a cluster ion beam is recommended. This is because of the special characteristics of clustered ion state, as detailed below. Low energy ion beams preferably are utilized to provide substantially defect-free crystal growth at low substrate temperatures. As a consequence, large area single crystal films can be grown on silicon substrates at room temperature, which heretofore has been considered to be impossible because of the large lattice mismatch It is also preferable for the epitaxial growth of aluminum films with cluster ion sources to use a low energy ion beam having an energy range of about 0.1 eV/atom to about 1000 eV/atom, more preferably, from about 1 eV/atom to about 500 eV/atom in a high vacuum atmosphere of typically about $10^{-4}$ to about $10^{-10}$ Torr. With monoatomic ion sources, the ions will preferably have an energy range of about 10 eV to about 10 keV. The substrate is also preferably maintained at a low temperature, for example, below about 200° C.

Alternatively, a deposition method can be employed that combines ion beam techniques and conventional physical vapor deposition (PVD) methods, which apply no acceleration to the depositing particles. In order to enhance the epitaxial growth of aluminum with such a method, the ion beams typically will play the main role of the deposition, and the conventional PVD methods can be used to increase the deposition rate. For example, electron beam induced vaporization of aluminum can be used to provide a supplemental source of aluminum during epitaxial growth of the reflective layer. In addition to ion beams, other deposition techniques can be used as well, including, for example, molecular beam epitaxy methods, chemical vapor deposition technique and the like.

The film thickness of the single crystal or bicrystal aluminum does not affect the reflection efficiency. Typically, the film thickness will range from about 0.01 microns to about several microns.

The single crystal or bicrystal aluminum films have smooth surface morphologies, and can fulfill the desired damage resistance. For practical applications, however, the single crystal or bicrystal films should be designed so as to avoid the absorption of the incident light and will typically range from 0.01 microns to about 10 microns. Various physical vapor deposition techniques can be employed, including, for example, sputtering, evaporation and electron beam enhanced vapor deposition and various ion beam deposition techniques to form the protective coatings.

Compared to the conventional aluminum deposited films, which do not form single crystals, but rather polycrystalline or amorphous structures, the single crystal or bicrystal aluminum films produced by the methods of the present invention have higher chemical and physical stability, higher reflective efficiencies, greater durability, better long-term stability, and exhibit less degradation of their reflective efficiency over time. In addition, over a broad range of usable wavelengths, their reflectivity is not dependent on the wavelength or incident angle of the light, which are characteristic for the multilayered dielectric films. As a result, the reflectors of the present invention can be manufactured at relatively low cost.

Substrates useful in the present invention include single crystalline materials, such as silicon and other semiconductors, as well as insulative materials, such as sapphire, quartz, and the like.

DESCRIPTION OF THE PREFERRED EMBODIMENTS

EXAMPLE 1

A Si(111) single crystal substrate was cleaned by acetone and trichloroethylene. Then the substrate was etched with hydrofluoric acid to remove the native oxide on the surface, and dipped in a mixture of sulfuric acid and hydrogen peroxide to form a thin protective oxide on the surface. After repeating this process for several times, the substrate was dried and set in a vacuum chamber. It was heated in the vacuum chamber at 800° C. to remove the protective oxide and prepare a clean surface. After this process, the substrate was ready for deposition.

An Al(111) single crystal film was then epitaxially grown on this Si(111) single crystal substrate by depositing aluminum cluster ions with the ionized cluster beam method. The ion beam acceleration voltage was between about 3 to 5 kV. The electron current for ionization was set to about 100 mA. The vacuum was about $1 \times 10^{-9}$ Torr, and the process was continued until the film thickness was more than 100nm.

After the formation of the Al(111) single crystal film, a $MgF_2$ protective overcoat was deposited on the surface to complete the optical reflector. The $MgF_2$ was 60 nanometers thick and was deposited by sputtering.

EXAMPLE 2

A Si(100) single crystal substrate was prepared by the same method as described in Example 1. An Al(111) bicrystal film was then epitaxially grown by depositing aluminum cluster ions by the ionized cluster beam method in the same manner as described in Example 1.

After the formation of the Al(111) single crystal film as stated above, a $MgF_2$ protective overcoat was deposited on the surface as in Example 1 to complete an optical reflector.

EXAMPLE 3

A Si(111) or Si(100) single crystal substrate was prepared by the same method as Example 1. On this Si(111) or Si(100) substrate, either Al(111) single crystal film or Al(110) bicrystal film, depending on the substrate, was epitaxially grown by depositing aluminum by the ionized cluster beam deposition, as described in Example 1, together with a supplemental use of electron beam deposition of aluminum to achieve an increased rate of deposition.

After the formation of the Al(111) bicrystal film as described above, a $MgF_2$ protective overcoat was deposited on the surface to complete the optical reflector.

EXAMPLE 4

A Si(111) or a Si(100) single crystal substrate was prepared as described in Example 1. Either an Al(111) single crystal or Al(110) bicrystal was formed on a vacuum of about $1 \times 10^{-9}$ Torr by irradiation with a monoatomic low energy ion beam of aluminum or argon ions at an acceleration voltage of several hundreds of eV to 5 keV with simultaneous but supplemental use of conventional electron beam deposition of aluminum.

After the formation of the Al(111) single crystal or Al(110) bicrystal film as described above, a $MgF_2$ protective overcoat was deposited on the surface to complete the optical reflector.

The performance of the optical reflectors prepared in Examples 1 to 4 was tested in a UV laser system. The light emitted from an ArF laser light ($\lambda = 193$ nm, power 0.12 joule/cm$^2$) was focused to increase the power density, and directed to irradiate the reflector at an incidence angle of 2 degrees for 5 to 10 seconds. The laser exposure was made for 500 to 1000 pulses at a pulse width of 20 nanoseconds and a repetition frequency of 100 Hertz. The damage threshold measured at several different points on the reflector was identified as follows:

| Example 1 | 0.4  | joule/cm$^2$ |
|-----------|------|--------------|
| Example 2 | 0.45 | joule/cm$^2$ |
| Example 3 | 0.35 | joule/cm$^2$ |
| Example 4 | 0.4  | joule/cm$^2$ |

For comparison, a reflector was prepared by depositing aluminum by conventional vacuum deposition. The damage threshold of this reflector measured by the same method was 0.1 joule/cm$^2$.

Other characteristics of the reflectors produced as Examples 1 to 4 were also studied. Again, ArF laser light ($\lambda = 193$ nm, power $= 0.12$ joule/cm$^2$) was used to irradiate the reflector at various incidence angles. The reflectors were also irradiated at different laser wavelengths and no decrease or increase of the reflected light intensity was observed. Optical reflectors according to the present invention produced with different films thicknesses were also tested and again no decrease or increase of the reflected light intensity was observed for different film thickness.

These results show that the epitaxially grown single crystal or bicrystal aluminum films can produce reflectors which have higher damage thresholds and superior durability compared to those produced by conventional deposition techniques (which yield either polycrystal or amorphous reflective coatings). The reflectors of the present invention are especially useful for directing UV laser light. However, since the Al films are superior in surface smoothness, they can be used as reflectors in a wide wavelength band ranging from infrared to ultraviolet. With the surface protective coating, they exhibit excellent mechanical stability and physical stability, and their reflection efficiencies do not deteriorate over long periods of use. In addition, over a broad range of wavelengths they are not dependent on wavelength or incident light angle, as are multilayered dielectric films. Therefore, the reflectors of the present invention have a degree of flexibility that allows one reflector to be used for lasers of different wavelengths. They also permit adjustment of the reflection angle in order to direct the light along a variety of paths without sacrificing reflective efficiency.

I claim:

1. In an optical system having a high energy, ultraviolet, laser light source emitting a light beam along a path and an optical reflector disposed in the beam path to reflect the light beam, the improvement comprising:
a reflector comprising a single crystalline substrate, an epitaxial layer of specularly reflective metal grown upon the substrate, and a transparent protective coating overlying the reflective metal layer.

2. The reflector of claim 1 wherein the substrate is a single crystal presenting a (111) crystal orientation.

3. The reflector of claim 1 wherein the substrate is a single crystal presenting a (100) crystal orientation.

4. The reflector of claim 1 wherein the substrate is a single crystal chosen from the group comprising silicon, sapphire and quartz.

5. The reflector of claim 1 wherein the reflective layer is a single crystal or bicrystal aluminum layer.

6. The reflector of claim 1 wherein the protective coating has a low ultraviolet light absorption coefficient.

7. The reflector of claim 1 wherein the protective coating is a material selection from the group consisting of magnesium fluoride, calcium fluoride and sodium fluoride.

8. In a method of efficiently reflecting a high energy, ultraviolet light beam emitted from a laser light source along a beam path, the improvement comprising:
disposing an optical reflector in the beam path to reflect the light beam, the reflector comprising a single crystalline substrate and an epitaxial layer of specularly reflective metal covered with a transparent protective coating.

9. The method of claim 8 wherein the step of disposing an optical reflector in the beam path further comprises disposing a reflector having a single crystalline silicon substrate and an epitaxial layer of specularly reflective aluminum.

10. The method of claim 8 wherein the epitaxial layer of specularly reflective metal is formed by directing a beam of aluminum ion clusters onto the substrate.

11. The method of claim 10 wherein the aluminum ion clusters are accelerated by an electric field to energies ranging from about 0.1 eV/atom to about 1000 eV/atom.

12. The method of claim 8 wherein the epitaxial layer of specularly reflective metal is formed by directing a monoatomic aluminum ion beam onto the substrate.

13. The method of claim 12 wherein the ions of a monoatomic ion beam are accelerated to energies ranging from about 10 eV to about 10 keV.

14. The method of claim 8 wherein the epitaxial layer of specularly reflective metal is grown in a low pressure environment.

15. The method of claim 14 wherein the low pressure ranges from about $10^{-4}$ Torr to about $10^{-10}$ Torr.

16. The method of claim 8 wherein the protective coating is formed by vapor deposition.

* * * * *